United States Patent [19]

Sun

[11] Patent Number: 5,463,394
[45] Date of Patent: Oct. 31, 1995

[54] CURRENT SWITCH FOR A HIGH SPEED DAC

[75] Inventor: Young-Jen Sun, Fremont, Calif.

[73] Assignee: NEC Electronics, Inc., Mountain View, Calif.

[21] Appl. No.: 259,813

[22] Filed: Jun. 15, 1994

Related U.S. Application Data

[63] Continuation of Ser. No. 90,598, Jul. 12, 1993, Pat. No. 5,373,294.

[51] Int. Cl.$^6$ .................................................. H03M 1/66
[52] U.S. Cl. .......................................... 341/136; 341/144
[58] Field of Search .................................... 341/136, 144, 341/150; 307/407; 326/62, 80

[56] References Cited

U.S. PATENT DOCUMENTS

| | | | |
|---|---|---|---|
| 4,825,178 | 4/1989 | Culican et al. | 331/116 R |
| 4,831,282 | 5/1989 | Colles | 307/443 |
| 5,255,240 | 10/1993 | Wong | 365/230.06 |
| 5,373,294 | 12/1994 | Sun | 341/136 |

OTHER PUBLICATIONS

Article entitled "A 10-b 70-MS/s CMOS D/A Converter" by Nakamura, et al, published in IEEE Journal of Solid-State Circuits, vol. 26, No. 4, dated Apr. 1991, pp. 637-642.

*Primary Examiner*—Brian K. Young
*Attorney, Agent, or Firm*—Skjerven, Morrill, MacPherson, Franklin & Friel; Ken J. Koestner

[57] ABSTRACT

A current switch for high-speed and high-resolution digital to analog converters (DACs) employs MOSFET devices to control the current switch output in response to binary input signals at logic level voltages. The current switch reduces ringing of the output current that occurs when switching takes place to improve DAC high speed performance by protecting current steering MOSFET transistors against application of the full swing voltage of the binary input signal by applying lower voltage switching signals in place of the full swing logic level voltages. Furthermore, the current switch compensates for parasitic capacitances within the current steering MOSFET transistor that drives the output current.

31 Claims, 3 Drawing Sheets

CURRENT SWITCH FOR A HIGH SPEED DAC

CROSS-REFERENCE TO RELATED APPLICATIONS

This application is a continuation of application Ser. No. 08/090,598, filed Jul. 12, 1993 now U.S. Pat. No. 5,373,294.

BACKGROUND OF THE INVENTION

1. Field of the Invention

This invention relates to converting signals from digital to analog form and, more particularly, to MOSFET current switches for high-speed digital-to-analog conversion of signals.

2. Description of the Related Art

High-speed and high-resolution electronic systems, such as high definition video systems, progressively require faster and more accurate conversion of signals from digital form to analog form. At higher speeds, it becomes more difficult to sustain linearity between the digital input signal and the analog output because of conversion errors introduced by the current switches of the DAC. Various approaches, based on p-channel MOSFET devices, have been suggested to improve the high speed performance of current switches used in DACs. In general, these approaches utilize a current cell that includes a p-channel MOSFET current source and two p-channel MOSFET steering transistors, each of which is capable of conducting the current made available by the current source. One steering transistor has its drain grounded. The other steering transistor, commonly known as the output transistor, has its drain connected to a current summing line of the DAC, the current of which represents the analog value of the digital input signal. A binary signal is applied to each current switch and circuitry is provided so that the binary signal is used to select one of the two transistors in the current cell for conduction of the current. If the output steering transistor is selected, the current from the current switch is combined on the current summing lines with the currents output by other current switches in the accumulation of an analog output proportional to the digital input signal. If the other steering transistor is selected, the current of the current switch is shunted and does not contribute to the total current on the current summing line.

One approach is represented by the current switch described in U.S. Pat. No. 4,831,282, entitled "CMOS INPUT CIRCUIT", issued to Joseph H. Colles on May 16, 1989. In this case, a biasing voltage controlled within precise limits is applied to the gate of the output steering transistor to reduce transient effects due to switching of the steering transistors in each current cell, thereby improving the accuracy of DACs.

A different type of current cell is described in an article by Y. Nakamura et al., entitled "A 10-b 70-MS CMOS D/A Converter", *IEEE Journal of Solid-State Circuits,* V26, N4, pp. 637–642, April 1991. The current cell includes three p-channel MOSFET transistors, one of which is a current source and the other two of which are steering transistors. The steering transistors are driven in phase opposition. Nakamura et al. observe that arrays of such current cells suffer graded and symmetrical errors and propose various measures to reduce the integral linearity error caused by these error distributions across the array.

Despite the development of these techniques, need still remains for a simple yet effective way to improve the high speed performance of DACs. One problem that arises in DACs is ringing of output analog signal.

SUMMARY OF THE INVENTION

The current switch of the present invention offers two improvements to address the problem of output signal ringing. First, the switch provides for the application of a reduced voltage level to the gate terminals of the current switch transistors. Second, the current switch compensates for parasitic capacitances within the current switch transistor that drives the output current.

In accordance with a first aspect of the present invention, a current switch is used to convert a binary logic signal having a particular voltage swing to a current signal. The switch includes three p-channel MOSFET transistors, a gating circuit and a capacitive device. A first of the three transistors has a gate fed by a first bias voltage, a source driven by a source voltage node and a common node drain connection. A second of the three transistors has a gate, a common node connection and a drain. A third transistor has a gate, a common node source connection and a reference voltage drain connection.

The gating circuit provides two binary output signals having a voltage swing less than that of the input binary logic signal. The first of the two output signals drives the gate of the second transistor and the second drives the gate of the third transistor. As the signal applied to the gate of a transistor changes between the logic level voltages, charge coupling effects cause artifactual variations in the output current signal. The gating circuit reduces these artifactual variations by reducing the voltage swing applied to the transistor gates.

The capacitive device has a first connection to the drain of the second transistor and a second connection to the second output of the gating circuit. Thus the output current signal conducts through the second transistor and through the capacitive device with the control signal to the capacitive device being applied in phase opposition to the signal controlling the second transistor. In this manner, the artifactual variation in the output current signal is reduced further.

In accordance with a second aspect of the invention, there is provided a method for switching a substantially constant current in a current switch. The current switch selects between respective conductive paths controlled by a first MOSFET transistor for regulating output current flow and a second MOSFET transistor for regulating shunting of the current to a reference potential. The method includes the step of providing an input voltage representing a binary digital value and generating first and second control signals as a function of the binary input value. These control signals are opposite in polarity and have a maximum voltage less than the input voltage. The first and second control signals are applied to the respective gates of the first and second MOSFET transistors to steer the current to the respective conductive paths. Application of the current steering control signals causes a deviance in the substantially constant current that enlarges for greater steering control signal voltage swings. Thus, the reduced voltage of the first and second control signals limits the deviance in the substantially constant current. Application of a capacitance to the conductive path controlled by the first MOSFET transistor compensates for the deviance in the substantially constant current by driving the applied capacitance in phase opposition to the application of the first control signal.

BRIEF DESCRIPTION OF THE DRAWINGS

Further objects, features and advantages of the invention will become apparent upon consideration of the following detailed description in conjunction with the accompanying drawings, in which.

DETAILED DESCRIPTION OF THE PREFERRED EMBODIMENT

I have found that problems of current overshoot and undershoot in the output of transistor current cells, which are switched by the phase opposite signals, are due to charging or discharging of the parasitic capacitances of the output transistor coupling its gate to its drain. These overshoots and undershoots cause excessive ringing on the current summing line, which limits the high speed performance of the DAC.

Figure 1:
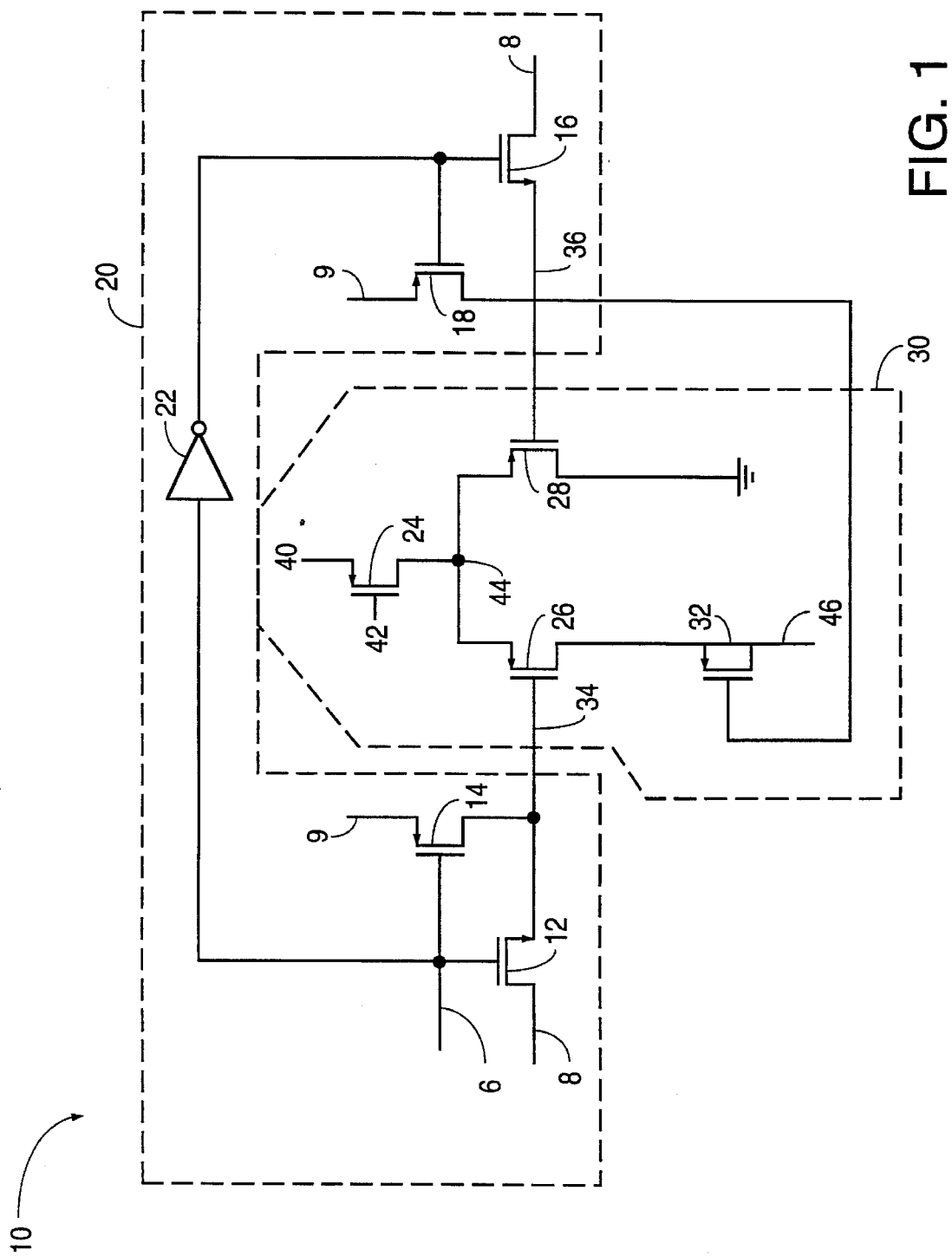
FIG. 1 is a schematic diagram of circuitry within a current switch that is provided to receive binary input voltage signals and to produce output currents that depict an analog representation of the digital signal.

The CMOS current switch 10 of FIG. 1 provides an output current advantageously having reduced overshoots and undershoots. The current switch 10 includes a gate switching circuit 20 and a current cell circuit 30. The current switch 10 is constructed to receive a binary input signal on input signal line 6 in the form of a logic 1 or a logic 0, the values of which relate to digital voltage levels, for example, generally about 5 V and 0 V, respectively. In response to the applied logic input signal on line 6, the current switch generates an output current signal 46 in which the current takes one of two values according to the logic value of the input signal on line 6.

The gate switching circuit 20 includes an input connection to the binary input signal line 6, an inverter 22 and four transmission gate transistors, of which two are p-channel MOS transistors 14 and 18 and two are n-channel MOS transistors 12 and 16. The transmission gate transistors are so-named in reference to their usage in switching the transmission of different voltage supplies to switches within the current cell circuit 30. Two constant voltage lines, 8 and 9, are included in the gate switching circuit 20. The voltages applied to lines 8 and 9 are substantially constant with the potential of the voltage 9 (for example, 3.5 V) having a greater magnitude than the potential of the voltage 8 (0 V). The potential of the voltage 9 is less than the logic 1 voltage level of the binary input signal on line 6 (for example, 5 V).

As is depicted in FIG. 1, the binary input signal line 6 is applied to the gate of the n-channel MOS transistor 12 and to the gate of the p-channel MOS transistor 14. The voltage 8 is applied to the source terminal of the n-channel MOS transistor 12 and the voltage 9 is applied to the source terminal of the p-channel MOS transistor 14. The drain terminals of n-channel MOS transistor 12 and p-channel MOS transistor 14 are coupled and applied to the gate of a p-channel MOS transistor 26 within the current cell 30 in a manner to be described hereinafter so that the transistor 26 becomes conductive when the binary input signal on line 6 takes a logic level 1 and the transistor 26 becomes non-conductive when the signal takes a logic level 0. The signal applied to the gate of transistor 26 may be termed a gating signal 34, that reflects the same logic value as the binary input signal on line 6. The logic value of the binary input signal on line 6 is inverted by the inverter 22 and then applied to the gate of the n-channel MOS transistor 16 and to the gate of the p-channel MOS transistor 18. The voltage 8 is applied to the source terminal of the n-channel MOS transistor and the voltage 9 is applied to the drain terminal of the p-channel MOS transistor 18. The source terminal of n-channel MOS transistor 16 and the drain terminal of the p-channel MOS transistor 18 are coupled and applied to a p-channel MOS transistor 28 within the current cell 30, as will be related in the later discussion of that circuit. The transistor 28 becomes non-conductive when the binary input signal on line 6 takes a logic level 1 and the transistor 28 becomes conductive when the signal takes a logic level 0. The signal applied to the gate of transistor 28 may be called an inverted gating signal 36, having a complementary relationship to the binary input signal on line 6.

Figure 2:
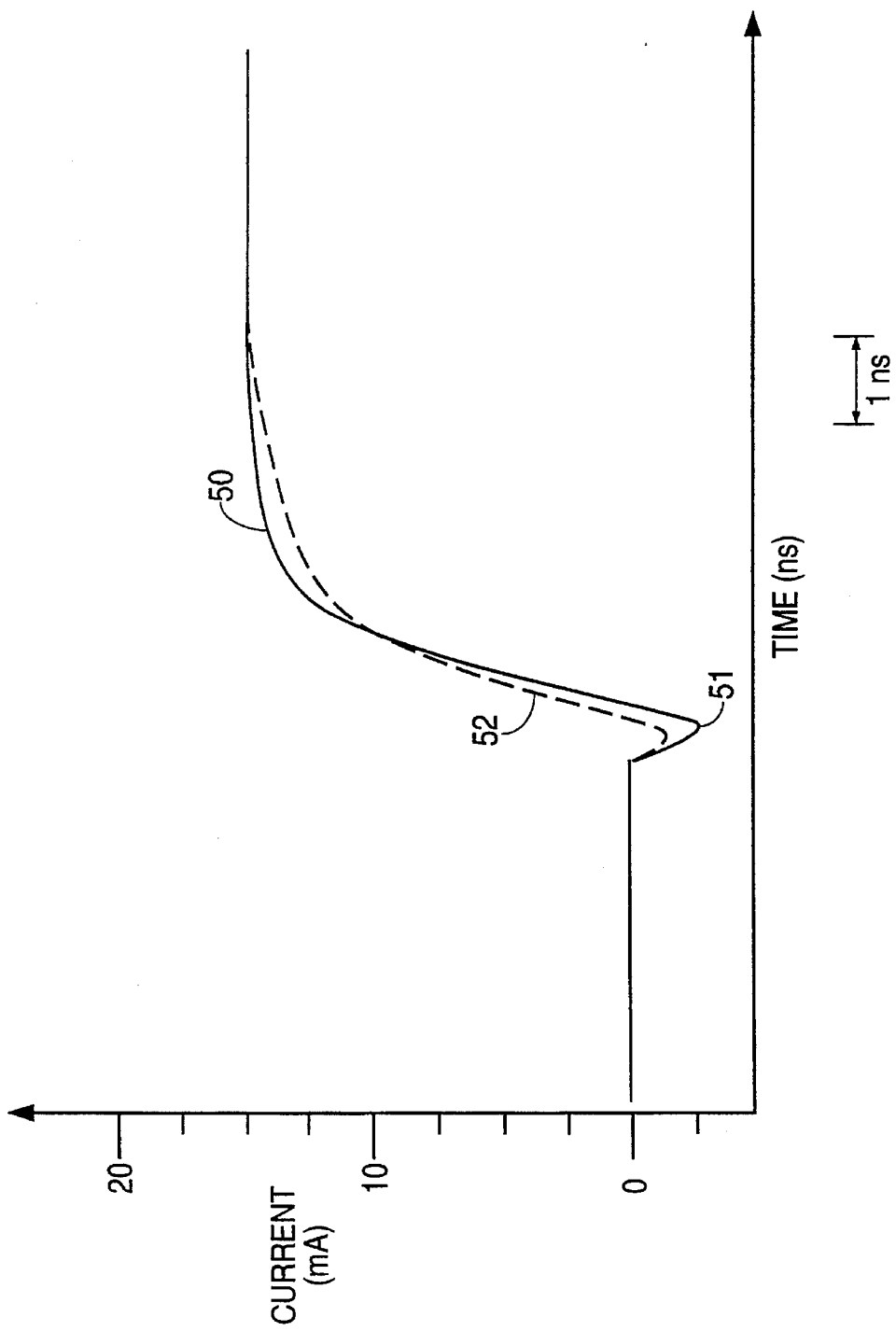
FIG. 2 is a graph depicting the response of the current switch of the present invention to a full-scale input increase.
Figure 3:
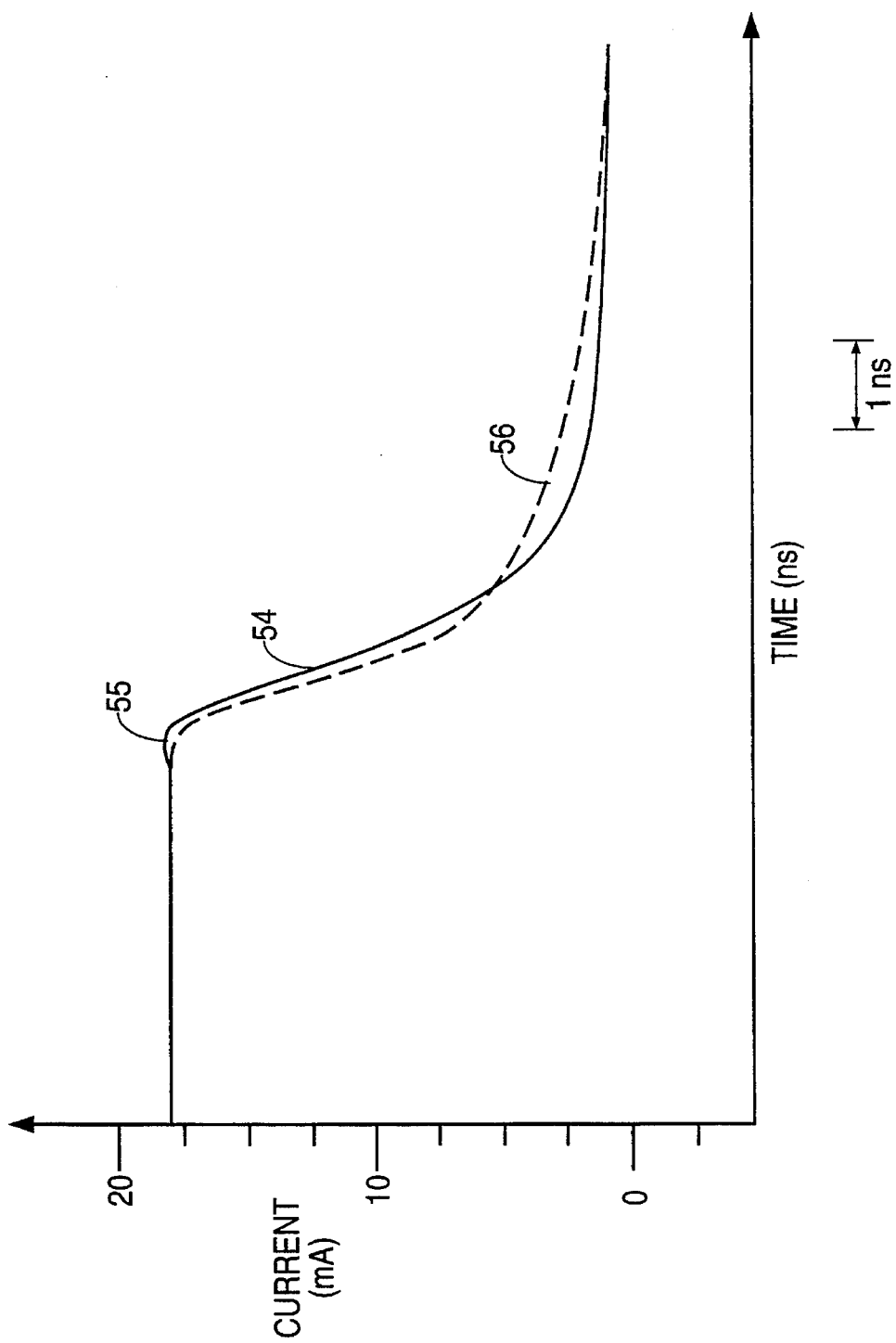
FIG. 3 is a graph depicting the response of the current switch of the present invention to a full-scale input decrease.

Conventional current switch circuits employ transistors in the manner in which transistors 26 and 28 are employed. However, conventional current switch circuits drive the gates of such transistors with logic level signals of 0 V and 5 V. The substantial change in gate voltage from 0 V to 5 V logic level signals in conventional current switch circuits causes the output current to undershoot as the current changes from no conducted current to a constant current. FIG. 2 graphically depicts the undershoot at point 51 of the solid-line electrical signal waveform 50, in which the output current changes in time as the binary input signal is changed. The graph of FIG. 2 is generated by the simulation of a conventional three-transistor (p-channel MOSFET) current cell driven with full-scale phase-opposed gating signals, as it responds to a change from a zero level digital input signal to a full-scale signal. In the same manner, as is shown in FIG. 3, a substantial change in gate voltage from 5 V to 0 V logic level signals in a conventional current switch circuit causes the output current to overshoot as the current changes from a constant current to no current; see point 55 on line 54.

The phenomena of overshoot and undershoot are believed to result from parasitic capacitance of the MOSFET devices in the three-transistor current cell. The parasitic capacitances of concern are a gate-channel capacitance $C_{gc}$ and a gate-drain capacitance $C_{gd}$. As the gate of a p-channel MOSFET is driven high, to a voltage greater than the MOSFET threshold voltage, current begins to flow through the channel of the MOSFET. Unfortunately, the capacitive components $C_{gc}$ and $C_{gd}$ must charge, thereby causing an undershoot. Similarly, as the gate is driven low, current flow begins to decrease. Unfortunately, the capacitive components $C_{gc}$ and $C_{gd}$ must discharge, thereby causing an overshoot.

The amplitude of the deviation in current caused by the overshoot and undershoot phenomena is related to the amplitude of the voltage driving the MOSFET gate, so that lower amplitude driving signals result in output current signals with smaller amplitude overshoots and undershoots. By minimizing the amplitude of these current deviations, the current switch 10 of FIG. 1 performs faster digital to analog signal conversion.

The current switch 10 protects the gates of the p-channel MOS current source transistors 26 and 28 from high logic level signals by interposing the transmission gate transistors 14, 12, 18 and 16 between the logic level binary input signal line 6 and gate terminals of the current source transistor 26 and 28. Although the signals applied to the gate terminals of the transmission gate transistors 14, 12, 18 and 16 vary within a full logic swing (0 V to 5 V), these gates have a high impedance so that the gate terminals of the current source transistors 26 and 28 are protected from the full logic level signals. The voltage levels applied to the gate terminals of transistors 26 and 28 are thus limited to the range between the voltages 8 and 9. Voltages 8 and 9 are selected to provide a reduced voltage change applied to the gates of current source transistors 26 and 28. The improvement in the undershoot and overshoot phenomena of the present invention, as is illustrated by a broken-line electrical signal waveform 52 of FIG. 2 and a broken-line electrical signal waveform 56 of FIG. 3, is partially a result of limiting the voltage applied to the gates of the steering transistors 26 and 28.

The current cell 30 also includes p-channel MOS transistors 24 and 32 and operates as follows. A current-generating potential, such as that provided by the CMOS circuit supply voltage line $V_{DD}$ 40, is applied to the source terminal of the p-channel MOS transistor 24 to source the current supplied by the circuit 30. A constant predetermined current, setting bias voltage 42 is applied to the gate terminal of transistor 24 to set the level of the current flowing through the current cell 30 to a constant value. Various suitable bias voltage generating circuits are well known in the art. The drain terminal of the transistor 24 is connected to the source terminals of the two p-channel MOS transistors 26 and 28, supplying a substantially constant current to node 44. The gate terminal of the transistor 26 is coupled to the gating signal line 34 and the gate terminal of the transistor 28 is connected to the inverted gating signal line 36 so that the logic value of the signal applied to the gate of the transistor 26 is always opposite the logic value of the signal applied to the gate of the transistor 28. The drain terminal of the p-channel MOS transistor 28 is coupled to a reference potential within the CMOS circuit, such as a ground potential. The drain terminal of the p-channel MOS transistor 26 is coupled to both the source and the drain terminals of the p-channel MOS transistor 32, which are shorted to provide a suitable capacitive device. The gate terminal of the transistor 32 is connected to the inverted gating signal line 36 so that the phase of the signal applied to the gate of the transistor 32 is opposite that applied to the gate of transistors 26.

The p-channel MOS transistor 32 is employed to compensate for the parasitic capacitances $C_{gc}$ and $C_{gd}$ of the p-channel MOS transistor 26.

The transistor 32 is added to the circuit as a "dummy" device in series with the output transistor 26. The source and drain terminals of transistor 32 are connected in a short-circuit and the signal applied to the gate of transistor 32 is in opposite phase with respect to the signal applied to the gate of transistor 26. Therefore, the charging and discharging of the parasitic capacitance of transistor 26 is compensated by the discharging and charging of the parasitic capacitance of the transistor 32, so that the undershoots and overshoots are reduced and the switching speed of the current switch 10 is increased.

The current switch 10 thus responds quickly to the logic level applied to the binary input signal line 6. When a voltage of approximately 5 V (logic 1) is applied to the input 6 of the gate switching circuit 20, 5 volts is applied to the gate of the n-channel MOS transistor 12 and to the gate of the p-channel MOS transistor 14, thereby causing the n-channel MOS transistor 12 to become conductive and the p-channel MOS transistor 14 to become non-conductive which, in turn, drives the p-channel MOS transistor 26 to a conductive state so that the current from the transistor 24 flows through the transistor 26 to the output 46. At the same time, the logic value on binary input 6 is inverted by the inverter 22 and a voltage of approximately 0 V is applied to the gate of the n-channel MOS transistor 16 and to the gate of the p-channel MOS transistor 18, thereby causing the n-channel MOS transistor 16 to become non-conductive and the p-channel MOS transistor 18 to become conductive which, in turn, place the p-channel MOS transistors 28 and 32 in a non-conductive state.

Alternatively, when the binary input signal on line 6 is logic level 0, a voltage of approximately 0 V is applied to the gate of the n-channel MOS transistor 12 and to the gate of the p-channel MOS transistor 14, thereby causing the n-channel MOS transistor 12 to become non-conductive and the p-channel MOS transistor 14 to become conductive which, in turn, set the p-channel MOS transistor 26 in a non-conductive state, resulting in an output current 46 of zero. At the same time, a voltage of approximately 5 V (logic 1) is applied to the gate of the n-channel MOS transistor 16 and to the gate of the p-channel MOS transistor 18, thereby causing the n-channel MOS transistor 16 to become conductive and the p-channel MOS transistor 18 to become non-conductive which, in turn, drives the p-channel MOS transistors 28 and 32 to a conductive state so that the current through the transistor 24 flows from the transistor 28 to the reference potential.

Although the invention has been described with reference to a particular embodiment, it is to be understood that the disclosed embodiment is merely illustrative of the application of the principles of the invention. Numerous modifications may be made therein and other arrangements may be devised without departing from the true scope and spirit of the invention.

I claim:

1. A current switch for furnishing a current signal determined by logic states of an input signal having a first voltage swing, comprising:

a gating circuit responsive to the input signal to generate first and second logic signals at respective first and second outputs thereof, the first and second logic signals having voltage swings less than the voltage swing of the input logic signal, and the second logic signal being inverse to the first logic signal;

a substantially constant current source;

a first field effect transistor having a gate coupled to the first output of the gating circuit, and having a source-drain path coupled between the current source and an output node; and a second field effect transistor having a gate coupled to the second output of the gating circuit, and having a source-drain path coupled between the current source and a reference voltage node.

2. A current switch as in claim 1 wherein the first and second transistors are p-channel type.

3. A current switch as in claim 1 wherein the current source comprises:

a voltage source;

a current select signal input; and a third field effect transistor having a gate coupled to the current select signal input and having a source-drain path coupled between the voltage source and the first and second field effect transistors.

4. A current switch as in claim 3 wherein the first, second and third transistors are p-channel type.

5. A current switch as in claim 1 wherein the gating circuit comprises:

an input node;

a first voltage limiter having an input coupled to the input node, and having an output furnishing the first logic signal;

an inverter having an input coupled to the input node and having an output; and a second voltage limiter having an input coupled to the output of the inverter, and having an output furnishing the second logic signal.

6. A current switch as in claim 5 wherein the first voltage limiter and the second voltage limiter comprise:

a first voltage limiter field effect transistor having a gate coupled to the voltage limiter input and having a source-drain path coupled between a first bias voltage source and the voltage limiter output; and a second voltage limiter field effect transistor having a gate coupled to the voltage limiter input and having a source-drain path coupled between a second bias voltage source and the voltage limiter output.

7. A current switch as in claim 6 wherein the first voltage limiter field effect transistor and the second voltage limiter field effect transistor have different conductivity types.

8. A current switch as in claim 1, further comprising:

a capacitive device having one terminal coupled to the output node and another terminal coupled to the gate of the second field effect transistor.

9. A current switch as in claim 8 wherein the capacitive device comprises:

an output terminal; and a capacitive device field effect transistor having a gate coupled to the gate of the second field effect transistor and having a source-drain path short-circuited and coupled between the output node and the output terminal.

10. A current switch as in claim 9 wherein the first and second transistors and the capacitive device transistor are p-channel type.

11. A current switch comprising:

an input node;

a first voltage limiter having an input coupled to the input node, and having an output;

an inverter having an input coupled to the input node and having an output;

a second voltage limiter having an input coupled to the output of the inverter, and having an output;

a substantially constant current source;

a reference voltage node;

a first field effect transistor having a gate coupled to the output of the second voltage limiter, and having a source-drain path coupled between the current source and the reference voltage node;

an output node;

a second field effect transistor having a gate coupled to the input node, and having a source-drain path coupled between the current source and the output node; and a capacitive device having one terminal coupled to the output node and another terminal coupled to the gate of the first field effect transistor.

12. A current switch as in claim 11 wherein the first and second transistors are p-channel type.

13. A current switch as in claim 11 wherein the current source comprises:

a voltage source;

a current select input node; and a third field effect transistor having a gate coupled to the current select input node and having a source-drain path coupled between the voltage source and the first and second field effect transistors.

14. A current switch as in claim 13 wherein the first, second and third transistors are p-channel type.

15. A current switch as in claim 11 wherein the first voltage limiter and the second voltage limiter comprise:

a first voltage limiter field effect transistor having a gate coupled to the voltage limiter input and having a source-drain path coupled between a first bias voltage source and the voltage limiter output; and a second voltage limiter field effect transistor having a gate coupled to the voltage limiter input and having a source-drain path coupled between a second bias voltage source and the voltage limiter output.

16. A current switch as in claim 15 wherein the first voltage limiter field effect transistor and the second voltage limiter field effect transistor have different conductivity types.

17. A current switch as in claim 16 wherein the capacitive device comprises:

an output terminal; and a capacitive device field effect transistor having a gate coupled to the gate of the first field effect transistor and having a source-drain path short-circuited and coupled between the output node and the output terminal.

18. A current switch as in claim 17 wherein the first and second transistors and the capacitive device transistor are p-channel type.

19. A current switch for converting, in a digital-to-analog converter, a binary input signal having first and second logic values to an output current signal, the current switch comprising:

an input terminal coupled to receive the binary input signal;

an inverter coupled at its input to the input terminal and having an output providing an inverted binary input signal;

a current source which generates a selected current at a current node;

a reference voltage terminal;

a first field effect transistor having a gate and a source-drain path coupled between the current source and a circuit node;

a second field effect transistor having a gate and a source-drain path coupled between the current source and the reference voltage terminal;

a first voltage range limiter having an input coupled to the input terminal to limit the binary input signal and having an output coupled to the gate of the first field effect transistor;

a second voltage range limiter having an input coupled to the inverter output to limit the inverted binary input signal and having an output coupled to the gate of the second field effect transistor;

a capacitive device coupled between the circuit node and an output terminal supplying an output current signal;

wherein the first field effect transistor is activated when the second field effect transistor is deactivated and the first field effect transistor is deactivated when the second field effect transistor is activated.

20. The current switch as claimed in claim 19, wherein the capacitive device comprises a third field effect transistor having a shorted source-drain path coupled between the circuit node and the output terminal and having a gate coupled to the output of the second voltage range limiter.

21. The current switch as claimed in claim 19, wherein the current source comprises a fourth field effect transistor which generates the current, the fourth field effect transistor having a source-drain path coupled between a voltage source and the current node and having a gate receiving a selected voltage, the selected voltage determining the selected current.

22. The current switch as claimed in claim 21, wherein the first, second and fourth field effect transistors have a same conductivity type.

23. The current switch as claimed in claim 21, wherein the first, second, third and fourth field effect transistor have a same conductivity type.

24. The current switch as claimed in claim 19, wherein the first voltage range limiter comprises:

a fifth field effect transistor having a source-drain path coupled between a first substantially constant voltage source and the gate of the first field effect transistor and having a gate coupled to the input terminal; and a sixth field effect transistor having a source-drain path coupled between a second substantially constant voltage source and the gate of the first field effect transistor and having a gate coupled to the input terminal.

25. The current switch as claimed in claim 24, wherein the second voltage range limiter comprises:

a seventh field effect transistor having a source-drain path coupled between the first substantially constant voltage source and the gate of the second field effect transistor and having a gate coupled to the inverter output terminal; and an eighth field effect transistor having a source-drain path coupled between the second substantially constant voltage source and the gate of the second field effect transistor and having a gate coupled to the inverter output.

26. The current switch as claimed in claim 19, wherein the second voltage range limiter comprises:

a seventh field effect transistor having a source-drain path coupled between a first substantially constant voltage source and the gate of the second field effect transistor and having a gate coupled to the inverter output terminal; and an eighth field effect transistor having a source-drain path coupled between a second substantially constant voltage source and the gate of the second field effect transistor and having a gate coupled to the inverter output.

27. A current switch for converting, in a digital-to-analog converter, a binary input signal having first and second logic values to an output current signal, the current switch comprising:

an input terminal for receiving the binary input signal;

an output terminal for furnishing the output current signal;

a reference voltage terminal;

a current source for furnishing a current of selected amount;

means for generating an inverted binary input signal having an opposite logic value to the binary input signal, the generating means having an input node connected to the input terminal and having an output node;

a first field effect transistor having a gate, and further having a source-drain path coupled between the reference voltage terminal and the current source;

a second field effect transistor having a gate, and further having a source-drain path coupled between the output terminal and the current source;

means for limiting voltage range of the binary input signal, the limiting means having an input node connected to the input terminal and an output node connected to the gate of the second field effect transistor;

means for limiting voltage range of the inverted binary input signal, the limiting means having an input node connected to the output node of the inverted binary signal generating means and having an output node connected to the gate of the first field effect transistor; and a capacitive device having a terminal coupled to the output terminal and another terminal coupled to the gate of the first field effect transistor;

wherein the first and second field effect transistors are mutually activated and deactivated.

28. The current switch as claimed in claim 27, wherein the capacitive device comprises a third field effect transistor having a shorted source-drain path coupled between the circuit node and the output node, and a gate connected to the gate of the first field effect transistor.

29. The current switch as claimed in claim 28, wherein the current source comprises a fourth field effect transistor having a source-drain path for conducting the current and a gate for receiving a selected voltage to control the current.

30. The current switch as claimed in claim 29, wherein the first, second and fourth field effect transistor are a same conductivity type.

31. The current switch as claimed in claim 29, wherein the first, second, third and fourth field effect transistor are a same conductivity type.

* * * * *